United States Patent [19]

Walsh

[11] Patent Number: 4,925,830
[45] Date of Patent: May 15, 1990

[54] LASER BASED METHOD FOR FORMING A SUPERCONDUCTING OXIDE LAYER ON VARIOUS SUBSTRATES

[75] Inventor: Fraser Walsh, Arlington, Mass.

[73] Assignee: Tracer Technologies, Inc., Somerville, Mass.

[21] Appl. No.: 181,656

[22] Filed: Apr. 14, 1988

[51] Int. Cl.$^5$ .............................. B05D 3/06
[52] U.S. Cl. ............................... 505/1; 427/62; 427/63; 427/53.1; 427/226
[58] Field of Search ............... 427/53.1, 54.1, 62, 427/63, 226; 505/1

[56] References Cited

U.S. PATENT DOCUMENTS

| | | | |
|---|---|---|---|
| H158 | 11/1986 | Frausto et al. | 219/121 LD |
| 3,364,087 | 1/1986 | Solomon et al. | 427/53.1 |
| 4,359,485 | 11/1982 | Donnelly et al. | 427/53.1 |
| 4,372,989 | 2/1983 | Menzel | 427/53.1 |
| 4,395,436 | 7/1983 | Bianchi et al. | 427/53.1 |
| 4,398,966 | 8/1983 | Kelly et al. | 148/4 |
| 4,451,302 | 5/1984 | Cochran et al. | 148/13.1 |
| 4,476,150 | 4/1984 | Rose | 427/10 |
| 4,477,316 | 10/1984 | Minamida et al. | 204/290 F |
| 4,627,896 | 12/1986 | Nazmy et al. | 204/37.1 |
| 4,644,127 | 2/1987 | La Rocca | 219/121 FS |
| 4,664,933 | 5/1987 | Kumakura et al. | 427/12 |
| 4,675,204 | 6/1987 | Nicoll et al. | 427/35 |
| 4,684,781 | 8/1987 | Frisch et al. | 219/121 LU |
| 4,759,947 | 7/1988 | Ishihara et al. | 427/53.1 |

FOREIGN PATENT DOCUMENTS

| | | | |
|---|---|---|---|
| 0077207 | 12/1982 | European Pat. Off. | 427/53.1 |
| 60-216560 | 10/1985 | Japan | 427/53.1 |

OTHER PUBLICATIONS

Kumakura et al "Ba-Y-Cu-O Superconducting Tape Prepared by Surface Diffusion Process", Jpn. J. Appl. Phys. 26(7) Jul., 1987 L1172-1173.

Picraux S. T., Pope L. E., "Tailored Surface Modificaiton by Ion Implantation and Laser Treatment Science", vol. 226, No. 4675 pp. 615-621 Nov. 9, 1984.

Molock C. R., Walters R. P., Fabis P. M. "Effect of Laser Processing on the Electrochemical Behavior of Fe-Cr Alloys" J. Electrochemical Soc. vol. 134 No. 2, pp. 289-294.

Cava R. J. van Dover R. B., Batlogg B. Rietman E. A. Bulk "Super conductivity at 36K in $La_{1.8} Sr_{.2} CuO_4$" Phys Rev. L. vol. 58 No. 4 1987 pp. 408-410.

Chu, C. W.; Hor P. H., Meng R. L., Gau L., Huang Z. J., Wang Y. Q. "Evidence of Superconductivity above 40K in the La-Ba-Cu-O Compound System" Phys. Ref. L. vol. 58 No. 4 1987 pp. 405-407.

Francisco J. C., Joyce S. A., Steinfeld, J. I. Walsh F. "Infrared Photochemistry of Alkyl-and Arylsilanes" Amer. Chem. Soc. vol. 88 No. 14, 1984, pp. 3098-3103.

*Primary Examiner*—Norman Morgenstern
*Assistant Examiner*—Roy V. King
*Attorney, Agent, or Firm*—Lorusso & Loud

[57] ABSTRACT

A laser based method for forming a superconducting oxide layer on various substrates is disclosed. The method comprises applying a dry salt precursor to the surface of a substrate and the heating the substrate by a laser beam which causes a superconducting oxide layer to be formed on the substrate without post annealing. An alternative embodiment comprises application of a salt solution precursor on the substrate surface. After the solution evaporates, the substrate is heated through laser energy and a superconducting oxide layer is formed on the substrate.

28 Claims, 1 Drawing Sheet

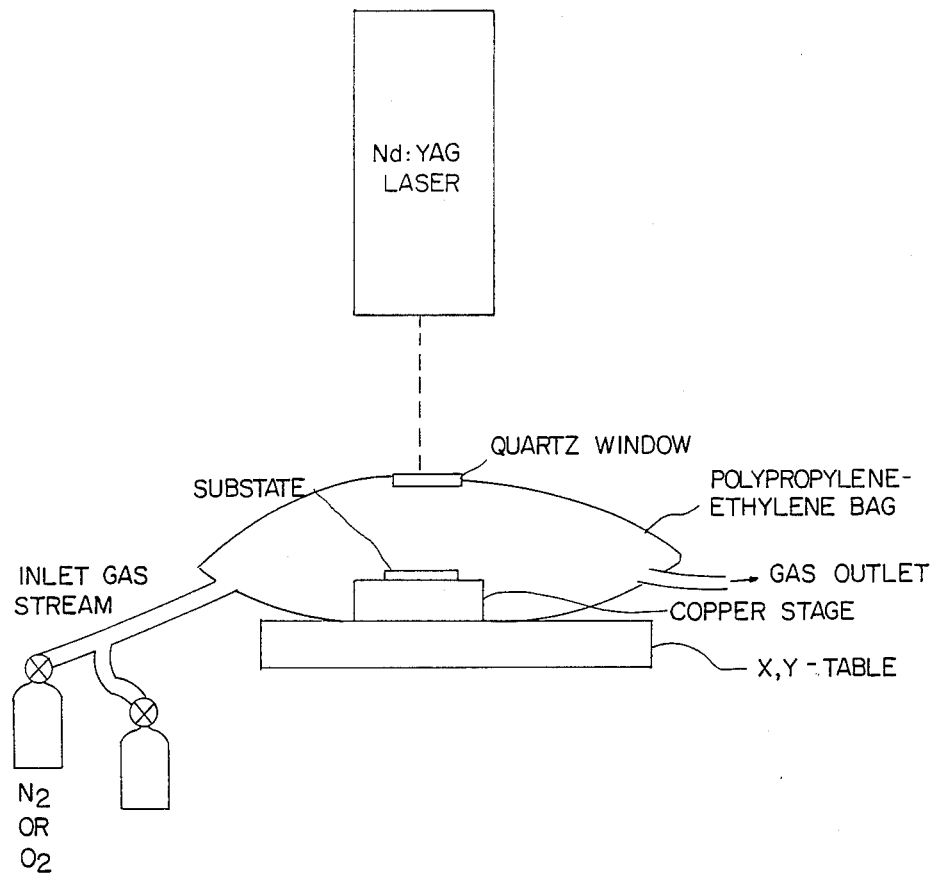

LASER BASED METHOD FOR FORMING A SUPERCONDUCTING OXIDE LAYER ON VARIOUS SUBSTRATES

CROSS REFERENCE TO RELATED APPLICATIONS

The present application is an improvement on copending application U.S. Ser. No. 176,878 filed on Apr. 4, 1988 entitled "A Laser Based Method For Forming A Ceramic Layer On Metal Substrates" by Fraser Walsh, the teachings of which are incorporated by reference.

BACKGROUND OF THE INVENTION

Ceramic materials have properties which make them of interest in many applications. These properties include thermal stress resistance, oxidation and corrosion resistance, and high strength. Selected cuprate perovskites have been recently identified as superconductors with high critical temperatures [Chu, C.W., et al., *Phys. Rev. Lett. Jpn. J. Appl. Phys.* 26, L1 (1987)]. Two silicon based ceramic materials, silicon carbide (SiC) and silicon nitride ($Si_3N_4$), have found use as engineering materials in high temperature applications because of their high melting temperatures, low coefficients of thermal expansion, and high resistance to oxidation. However, they are strongly covalently bonded and dissociate rather than melt. These properties make them difficult to sinter to full density. Further, they are highly abrasive and thus difficult to machine.

Methods for the formation of silicon based ceramic forms have included hot-pressing, reactive bonding and sintering with or without additives. Each of these processes has advantages, be they in cost or in the properties of the resulting material, however, the adhesion of the ceramic surface layer has been suspect in most applications of date. There have been no known references to date describing use of laser-energy-induced surface reactions to form silicon based ceramic layers on surfaces which layers resist peeling on thermal cycling or nominal physical abrasion.

Methods for formation of selected cuprate perovskites as superconductors with high critical temperatures include metathetic processes involving heating, pressing and sensitization in air or oxygen atmospheres of mixtures of copper oxide with materials such as a barium oxide, barium carbonate or barium nitrate and yttrium oxide. Additional preparation methods include sputtering of these elements, electron beam evaporation, melt-processing, and eximer-laser based film formation by preformed surface ablating via evaporation and material transfer to a receiving surface. There have been no known references to date of a laser based method of formation of a cuprate perovskite at a metal surface using laser based energy in such a manner so that the cuprate perovskite remains superconducting with a high critical temperature and is linked to the metal surface so that the two materials (e.g., the cuprate perovskite and the metal) do not separate under repeated temperature cycling or nominal physical abrasion.

Laser processing of metal surfaces has been successfully used to modify metal surface properties either by forming in situ a protective metal surface coat (i.e., stellite or tribaloy on steel) or by resolidifying the underlying metal. Techniques have been developed using a high power laser where metal powder layers are applied and melted in continuous processes to provide protective layers or regions on metal surfaces from the metal powders without reaction between the metal powder and the metal surface. The resulting protective layers have significantly improved erosion or corrosion resistance [Brennan, E.M. and B.H. Kerr, Chapt. in *Laser Materials Processing*, M. Bass, Ed., North-Holland, NY. p.237 (1983)]. For example, layering of conventional stainless steel (AISI 304) with a laser formed metal alloy containing 29% chromium and 13% nickel significantly improved its corrosion resistance [Lurnsden, J.B., et al., Chapt. in *Corrosion of Metals Processed by Directed Energy Beams*, C. R. Clayton and C.M. Preece, Eds., AIME, Warrendale, PA, p 129 (1982)]. The resulting metal surface layer has a chemical composition which differs from the bulk metal but the surface is not a ceramic in that it is not made essentially from a nonmetallic mineral.

Laser processing parameters for surface modification must be tailored to obtain the desired extent of surface melting or layer formation. Parameters of importance include laser wavelength, power density, time of exposure (target velocity, laser pulse duration and frequency), and inert gas coverage of sample. The required values of these parameters will vary both with substrate and layering materials.

Laser processing of a surface involves surface layer heating due to carrier scattering and phonon formation of the absorbed incident light. Absorption of the laser energy into a metal, carbon or ceramic surface can cause the localized temperature to rise sufficiently to cause melting and surface recrystallization with extent and depth dependent upon thermophysical properties of the substrate surface. Melt depth, solidification velocity and cooling rate affect the properties of the processed surface. By way of example, with the example not intended to limit the type of laser which can be used in the subject invention, a Nd:YAG (Raytheon SS-501) laser rated at 400 watts with a pulse width of 2 milliseconds was used to heat metal surfaces. Surface temperatures of metals heated with this laser are on the order of 2000 to 3000° C. given a measured bulk temperature of 600° C. and an estimated solidification velocity of approximately 10 cm/sec and a cooling rate of $10^6$ °K/sec. At temperatures on this order of magnitude, surface metal atoms will undergo significant electronic excitation (e.g., radical formation) which in turn means that they may chemically react with active gaseous species at the metal-gas interface. Such reactions should produce a surface layer which incorporates underlying surface atoms chemically linked to the silicon, carbon, copper, nitrogen or other reactive atoms in the ceramic. Whether there is a negative gradient of atoms from the bulk substrate surface to the ceramic layer surface or whether the ceramic layer surface has an excess of bulk substrate atoms due to density differences of the molecules formed in the laser based process will affect the properties of the ceramic layer.

SUMMARY OF THE INVENTION

In accordance with the present invention it has been discovered that a metal, ceramic or carbon substrate can be modified by the application of a ceramic layer which layer is intimately linked to the substrate via an interphase layer and which ceramic layer is formed on and linked to the substrate through the use of energy from a laser beam. This modification can result in increasing the chemical corrosion resistance or the elevated temperature oxidation decay resistance of the substrate. The modification can also result in the formation of a layered material with advantageous characteristics such as a metal wire with surface layer of a high temperature superconducting ceramic which has the beneficial properties of both the superconducting ceramic and the flexible wire.

A object of the present invention of substrate surface modification is the formation of a bulk ceramic layer on a bulk substrate where the ceramic laYer has high adherence to the substrate due to the presence of an interphase layer which contains atoms of both the bulk substrate and the ceramic layer.

A further object of the present invention is the formation of the adherent ceramic layer in specific regions or zones of the substrate through the controlled application of the energy of the laser beam to the specific zone or region of the surface of the substrate.

BRIEF DESCRIPTION OF THE DRAWINGS

FIG. 1 shows a block diagram of a reaction apparatus.

DESCRIPTION OF PREFERRED EMBODIMENTS

The present invention is applicable to any metal, carbon or ceramic surface which can be heated sufficiently by a laser beam to cause the atoms of the surface to be reactive. In this regard it should be noted that the surface may not necessarily be heated directly by the laser beam. Materials used in forming the ceramic layer and applied to the substrate surface may be heated by the laser beam and the heat transferred at a sufficient rate to cause the atoms of the substrate surface to be reactive. The metal used as this substrate can be, for example, titanium, molybdenum, various grades of stainless steel, zinc, copper and aluminum in the form of foil, rod, plate, screen, wire or powder. The carbon used can be graphitic carbon and non-graphitic in the form of rod, fiber, woven fiber., plate or powder. The ceramic used can be, for example, in the form of film, powder or fiber, and consist of metal oxides, nitrides and carbides including copper oxide, silicon carbide, titanium carbide, silicon nitride, titanium carbide or molybdenum carbide.

The ceramic layer formed in the present invention on the substrate surface can consist of any combination of atoms capable of being rendered reactive by the energy in the laser beam at or near the substrate surface. The components of the ceramic layer can be delivered to the reaction zone as gaseous or solid materials or can be present on the substrate surface. These components can be delivered in the gas atmosphere surrounding the reaction zone, can be physically applied to the reaction zone either as a wet or dry mixture before application of the laser beam, or can be formed at or near to the reaction zone by other physical or chemical means such as the thermal degradation of an organosilane, such as phenylsilane, which occurs in MIRPD (Multiple Infrared Photon Dissociation) using a $CO_2$ laser. Ceramics formed in the present invention include silicon carbide, titanium carbide, zirconium carbide, and tantalum carbide, silicon nitride, titanium nitride, zirconium nitride and tantalum nitride, and cuprate perovskites In the present invention, the ceramic layer formed on the substrate surface adheres to the substrate surface due to the presence of an interphase layer. This interphase layer can consist of atoms of both the ceramic layer and the substrate in an atomic ratio dependent upon the extent of chemical reaction between these atoms and level of activation energy of the laser beam. The interphase layer for silicon carbide on titanium, for example, consists of titanium atoms, titanium carbide molecules, and silicon carbide molecules with the ratio dependent upon the distance from the bulk substrate or the bulk ceramic layer. By way of a second example, the interphase layer of a superconducting cuprate perovskite consisting of $YBa_2Cu_3O_{7-x}$ on a copper metal plate contains the atoms of the cuprate perovskite, of copper oxide and of copper metal.

In the present invention, any laser can be used which can supply sufficient energy at the reaction zone to activate the atoms forming the interphase layer and the ceramic layer. Lasers used can be, for example, Nd:YAG, eximer, or $CO_2$ lasers.

The advantages of the present invention are illustrated by the following non-limiting examples.

EXAMPLE 1

A reaction chamber was used and is shown in FIG. 1. This chamber consisted of a polypropylene-ethylene zip lock bag (8 inches by 12 inches). A small quartz window (2 inches by 2 inches) was glued into the surface of the bag.

A sample of carbon felt obtained from Stackpole Carbon Company consisting of interwoven fibers of graphitic carbon (0.6 mm thick; 4 cm × 8 cm) was used as the substrate in the reaction chamber described. The gas atmosphere in the chamber consisted of nitrogen to which was added in approximately a 1 to 10 ratio a gas mixture of 0.5 percent by volume of silane in nitrogen. The copper stage in the chamber rested on a the surface of an x,y-table which was operated to move the carbon felt piece on the x-axis at approximately 4 cm/min for a distance of 4 cm, then to advance on the y-axis for approximately 0.3 cm and the to move back along the x-axis for 4 cm. The front surface of one side of the carbon substrate was layered with a silicon rich film. A Nd:YAG laser operating at 320 PFN at 75 Hz with a beam power density of approximately 500 $W/cm^2$ was directed at the carbon substrate through the quartz window (z-axis). The zone where the laser beam impinged on the carbon felt was observed to glow red hot and a small flame was observed to trail the laser beam as it progressed across the substrate surface. A silicon rich ceramic layer was formed on the surface of the carbon substrate on the area which had been heated by the laser beam. After ceramic layer formation, the substrate could be folded repeatedly without obvious change in the appearance of the ceramic film. This layered substrate was placed in a muffle furnace at 500° C. in air with the treated side up for approximately 2 hours and then removed. The ceramic layered substrate showed a weight loss of 12%. A similar piece of carbon felt which had not been ceramic layered showed a weight loss of 40% upon similar elevated temperature treatment. The ceramic layered substrate was then held at 750° C. for 1 hour in air. The substrate showed considerable loss of material from the side which had not been layered. The side of the substrate on which had been formed the ceramic layer remained uniform in appearance with a grayish protective layer which was fibrous in nature with the fiber structure similar to the carbon fiber structure of the surface of the carbon substrate. On those regions of the substrate which had lost all of the carbon material, there remained intact the grayish layer of ceramic, otherwise the ceramic layer remained firmly adherent to the carbon substrate. A control piece of carbon felt heated under similar conditions showed no residual ceramic film and almost complete loss of carbon material. The differences observed in extent of loss of material and the presence of the adherent ceramic film after heat treatment demonstrate the benefits of the laser based method of application of a ceramic film in providing graphitic carbon increased elevated temperature oxidative resistance. A method of forming silicon carbide crystals, as single strands or a fibrous mat, is also demonstrated by this example.

EXAMPLE 2

A piece of copper plate (3 mm thick; 4 cm by 8 cm) was used in the reaction apparatus shown in FIG. 1, as described in Example 1. The gas atmosphere in the reaction chamber was oxygen. When the Nd:YAG laser beam was incident upon the substrate, the majority of the energy was reflected and the substrate did not heat appreciably. A uniform layer approximately 2 mm thick of salts as 50 percent solution (by weight) in water:ethanol (1:4) with 1% sorbital as thixothropic agent was applied to the copper substrate surface and the solvents removed by evaporation. This layer contained a 1:2:3 atomic ratio of yttrium, barium and copper as the oxides. This coated piece was then used as the substrate in the reaction chamber described with a gas atmosphere of oxygen. The Nd:YAG laser was operated at 400 PFN at 75 Hz with a laser beam power density of approximately 1.5 kW/cm$^2$. A white flame jet of approximately 0.5 cm in length was observed a the point on the substrate where the laser beam was incident. A black ceramic surface layer of approximately uniform appearance and a thickness of less than 1 mm was observed to have been formed on those regions of the substrate which had been impinged upon by the laser beam energy. This ceramic layer was not removed by scratching.

When this ceramic coated substrate was repeatedly allowed to reach temperature equilibrium in liquid nitrogen and then warmed to room temperature, the ceramic layer remained adherent to the substrate throughout the cool-heat cycle. When the ceramic coated substrate was heated to 250° C. in air or oxygen, the ceramic layer remained adherent throughout the heat-cool cycle. Those regions of the copper substrate not coated With the ceramic showed the formation copper oxide scale under these conditions. When the ceramic coated substrate was heated to 750° C. in an oxygen atmosphere, the ceramic layer remained adherent until the substrate cooled to approximately 100° C. at which point the ceramic layer separated from the substrate revealing a white gray layer on that surface of the ceramic which had been the interphase layer between the bulk ceramic and the bulk copper substrate While the front face of the ceramic layer remained dark black. This white gray layer is a copper oxide and its presence demonstrates that the atomic composition of the interphase layer is not identical to the composition of the bulk ceramic, with the interphase layer being richer in copper and thus subject to increased oxide formation under elevated temperature oxygen rich conditions with oxygen diffusing through the oxide-rich bulk ceramic.

When a ceramic-coated copper substrate prepared as described in first paragraph of this example Was brought to the temperature of liquid nitrogen and then placed with the ceramic coated portion of the substrate near to the face of a SmCo$_5$ magnet (1 mm$^2$ SA) hanging as a pendulum on a 30 cm long string, the magnet was observed to be repulsed and held at approximately 1 mm off the surface of the ceramic coated-portion of the copper substrate even when forced 3 to 4 degrees off of the perpendicular until the ceramic-coated substrate warmed past its critical temperature. This response of the magnet demonstrates that the ceramic-coated portion of the substrate is acting as a superconductor with a critical temperature of approximately 90° K. When the portions of the ceramic layer which were obtained in the 750° C. heating test described in the previous paragraph were formed into a pellet and then cooled in liquid nitrogen, the pellet was observed to also repulse the magnet. These results demonstrate that the laser based method can be used to form ceramic materials which are adherent to a metal substrate and which, when formed to contain a suitable atomic ratio of active elements, can act as high critical temperature superconductors whether as ceramic layers on the substrate or as a free ceramic.

EXAMPLE 3

A cuprate perovskite ceramic was formed on a zinc metal substrate following the process described in Example 2. The zinc metal substrate was approximately 2 mm thick and 3 cm×5 cm in dimension. Two regions (each 1 cm×3 cm) layered with the cuprate perovskite were formed on the surface of this metal substrate by applying the Nd:YAG laser energy to the desired salt coated region of the substrate surface.

Following ceramic formation, the ceramic layered substrate was brought to temperature equilibrium with liquid nitrogen, the sample was then warmed to room temperature. Similar repeated cooling and warming of the ceramic-layered metal did not result in an apparent physical separation of the ceramic layer from the metal substrate. This example shows that the method can be used to form adherent ceramic-layers on substrates where the bulk substrate and the bulk ceramic do not contain the same atom.

EXAMPLE 4

A cuprate perovskite ceramic containing bismuth, strontium, calcium and copper oxides was formed on a copper metal substrate using the procedures described in Example 2. A uniform layer approximately 2 mm thick of a mixture of dry powders of bismuth, calcium, strontium and copper prepared in a 1:1:1:2 atomic ratio was applied to the copper substrate; this coated piece was then used as the substrate in the reaction chamber described in Example 2 and shown in FIG. 1 with oxygen as the gas atmosphere. The Nd:YAG laser was operated at 400 PFN at 75 Hz with a laser beam power density of approximately 1.5 kW/cm$^2$.

The ceramic-layered substrate prepared demonstrated similar physical appearance and stability compared to that prepared as described in Example 2. When cooled to liquid nitrogen temperature, and then brought near to the face of a SmCo$_5$ magnet (1 mm$^2$ SA) hanging as a pendulum on a 30 cm long string, the magnet was observed to be repulsed and held at approximately 1 mm off the surface of the ceramic-coated portion of the copper substrate even when forced 3 to 4 degrees off of the perpendicular until the ceramic-coated substrate warmed past its critical temperature. This response of the magnet demonstrates that the ceramic-coated portion of the substrate is acting as a superconductor with a critical temperature of approximately 90° K.

The invention has been described with reference to its preferred embodiments, other embodiments can achieve the same results. Those skilled in the art will recognize that the uses of ceramic-layered metals protected from chemical corrosion and from oxidation decay are many and include uses as structural materials, engineering materials, and system components as well as electrodes in electrochemical cells. Variations and modifications of the present invention will be obvious to those skilled in the art. It is intended that the present scope of the invention cover all such modifications and equivalents.

What I claim is:

1. A method for forming a superconducting ceramic layer on a substrate comprising:
    applying a solution of salts to the substrate wherein the salt mixture contains yttrium, barium, and copper in a 1:2:3 atomic ratio;
    evaporating the solution to leave a layer of salts on the substrate;
    heating the substrate by passing the substrate through the path of a laser beam;
    producing reactive species from the salts at the surface of the substrate through the energy of the laser beam which causes the reactive species to react with the surface substrate to form a ceramic layer intimately connected with the substrate.

2. The method according to claim 1, wherein the salts are oxides.

3. The method according to claim 1, wherein the salts are carbonates.

4. The method according to claim 1, wherein the salts are nitrates.

5. The method according to claim 1 wherein the substrate is copper.

6. The method according to claim 1 wherein the substrate is zinc.

7. The method according to claim 1 wherein the laser beam is produced by a Nd:YAG laser.

8. A method for forming a superconducting ceramic layer on a substrate comprising:
    applying a layer of dry salts to the surface of the substrate wherein the dry salts contain yttrium, barium and copper in a 1:2:3 atomic ratio;
    heating the substrate by passing the surface through the path of a laser beam;
    producing reactive species from the salts at the surface of the substrate through the energy of the laser beam which causes the reactive species to react with the surface substrate to form a ceramic layer intimately connected to the substrate.

9. The method according to claim 8, wherein the salts are oxides.

10. The method according to claim 8, wherein the salts are carbonates.

11. The method according to claim 8, wherein the salts are nitrates.

12. The method according to claim 8 wherein the substrate is copper.

13. The method according to claim 8 wherein the substrate is zinc.

14. The method according to claim 8 wherein the laser beam is produced by a Nd:YAG laser.

15. A method for forming a superconducting layer on a substrate comprising:
    applying a solution of salts to the substrate wherein the salt mixture contains bismuth, calcium, strontium and copper in a 1:1:1:2 atomic ratio;
    evaporating the solution to leave a layer of salts on the substrate;
    heating the substrate by passing the substrate through the path of a laser beam;
    producing reactive species from the salts at the surface through the energy of the laser beam which causes the reactive species to react with the surface substrate to form a ceramic layer intimately connected with the substrate.

16. The method according to claim 15, wherein the salts are oxides.

17. The method according to claim 15, wherein the salts are carbonates.

18. The method according to claim 15, wherein the salts are nitrates.

19. The method according to claim 15, wherein the substrate is copper.

20. The method according to claim 15, wherein the substrate is zinc.

21. The method according to claim 15, wherein the laser beam is produced by a Nd:YAG laser.

22. The method for forming a superconducting ceramic layer on a substrate comprising:
    applying a layer of dry salts to the surface of the substrate wherein the dry salts contain bismuth, calcium, strontium and copper in a 1:1:1:2 atomic ratio;
    heating the substrate by passing the surface through the path of a laser beam;
    producing reactive species from the salts at the surface of the substrate through the energy of the laser beam which causes the reactive species to react with the surface substrate.

23. The method according to claim 22, wherein the salts are oxides.

24. The method according to claim 22, wherein the salts are carbonates.

25. The method according to claim 22, wherein the salts are nitrates.

26. The method according to claim 22, wherein the substrate is copper.

27. The method according to claim 22, wherein the substrate is zinc.

28. The method according to claim 22, wherein the laser beam is produced by a Nd:YAG laser.

* * * * *